United States Patent [19]

Herzer

[11] 4,260,448

[45] Apr. 7, 1981

[54] PROCESS FOR DECREASING CRYSTAL DAMAGES IN THE PRODUCTION OF N-DOPED SILICON BY NEUTRON BOMBARDMENT

[75] Inventor: Heinz Herzer, Burghausen, Fed. Rep. of Germany

[73] Assignee: Wacker-Chemitronic Gesellschaft fur Elektronik-Grundstoffe mbH, Burghausen, Fed. Rep. of Germany

[21] Appl. No.: 889,172

[22] Filed: Mar. 23, 1978

[30] Foreign Application Priority Data

Dec. 1, 1977 [DE] Fed. Rep. of Germany ....... 2753488

[51] Int. Cl.$^3$ .................................................. C30B 31/20
[52] U.S. Cl. ............................ 156/605; 156/DIG. 64; 176/10
[58] Field of Search .............. 156/600, 605, DIG. 64; 252/62.3 E; 176/10

[56] References Cited

U.S. PATENT DOCUMENTS

| | | | |
|---|---|---|---|
| 3,255,050 | 7/1966 | Klahr | 176/10 |
| 3,967,982 | 7/1976 | Arndt et al. | 176/10 |
| 4,027,051 | 5/1977 | Reuschel et al. | 176/10 |
| 4,042,454 | 8/1977 | Hass et al. | 176/10 |
| 4,119,441 | 10/1978 | Hass et al. | 176/10 |
| 4,129,463 | 4/1978 | Cleland et al. | 252/62.3 E |

FOREIGN PATENT DOCUMENTS

| | | | |
|---|---|---|---|
| 1948884 | 4/1971 | Fed. Rep. of Germany | 176/10 |
| 2519663 | 11/1976 | Fed. Rep. of Germany | 156/605 |

OTHER PUBLICATIONS

Mills et al., "Preparation . . . ", J. Elec. Chem. Soc., 2-1961, pp. 171-175.
Klahr et al., "Neutron . . . ", Nucleonics, vol. 22, #4, pp. 62-65, 1964.
Herzer et al., "Doping . . . ", 1975.
Cheng et al., "Photoconductivity . . . ", J. of Appl. Physics, vol. 41, #6, S-1970, pp. 2627-2635.
Mirianashvili et al., "Possibility . . . ", Soviet Physic-Semiconductors, vol. 4, #10, 1612-1615, 4-71.

*Primary Examiner*—Bradley Garris
*Attorney, Agent, or Firm*—Allison C. Collard; Thomas M. Galgano

[57] ABSTRACT

A process for decreasing crystal damages in the production of n-doped silicon by neutron bombardment, in which phosphorus atoms are formed from silicon by nuclear transmutation, wherein the number of desired phosphorus atoms $N_{31p}$ per cc, can be calculated by the known equation $$N_{31p} = N_{30Si} \cdot \sigma \cdot \phi \cdot t$$

in which $N_{30Si}$ is the number of $^{30}$Si-isotopes per cc, $\sigma = 0.13$ barn effective cross section, $\phi$ the flux density of the thermal neutrons per cm$^2$ and t the bombardment time in seconds, the process consisting of adjusting the ratio between thermal and fast neutrons in the neutron flux acting upon the bombarded silicon work piece, so that the higher the ratio, the higher the specific resistance of the bombarded silicon, and thus, the lower the number of $N_{31p}$ and therewith the acting dose $\phi \cdot t$.

6 Claims, No Drawings

PROCESS FOR DECREASING CRYSTAL DAMAGES IN THE PRODUCTION OF N-DOPED SILICON BY NEUTRON BOMBARDMENT

The invention relates to a process for decreasing the damages of a crystal brought about in the production of n-doped silicon by neutron bombardment, in which phosphorus atoms are formed from silicon by nuclear transmutation. In this process, the number of desired phosphorus atoms $N_{31p}$ per cc can be calculated by the known equation $$N_{31p} = N_{30Si} \cdot \sigma \cdot \phi \cdot t$$

wherein $N_{30Si}$ is the number of $^{30}$Si-isotopes per cc, $\sigma = 0.13$ barn effective cross section, $\phi$, the flux density of the thermal neutrons per cm$^2$, and t the bombardment time in seconds.

For the production of semiconductor devices, silicon crystals are frequently used which were obtained by crucible-free zone melting. The doping of thus-produced silicon crystals with phosphorus for the adjustment of electrical conductivity of the n-type, can conventionally be done by a so-called "core doping" (Seelendotierung), i.e., by the addition of suitable doping substances in the advance rod, or by addition of such substances during float-zoning. However, both processes lead to an inhomogeneous distribution in the growing silicon monocrystal, both in the macroscopic and the microscopic sense. The inhomogeneous macroscopic distribution is shown by the appearance of a radial gradient of the electrical resistivity, whereas the inhomogeneous microscopic distribution results in the formation of "striations," which are microfluctuations of the electrical resistivity, due to inhomogeneous doping substance incorporation.

There is a third process known for avoiding inhomogeneous distribution of the doping substance, which was first described by M. Tanenbaum and A. D. Mills in J. Electrochem. Soc. 108, 171 (1961). That process is based on the striation-free phosphorus doping of silicon by means of nuclear transmutation by way of the neutron capture reaction

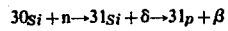

In that process, the desired resistivity is adjusted in a simple manner by determining the effective neutron flux $\phi$ and the bombardment time t from the equation $$N_{31p} = N_{30Si} \cdot \sigma \cdot \phi \cdot t$$

wherein $N_{31p}$ is the number of desired phosphorus atoms, and $\sigma = 0.13$ barn for the effective cross section of the capturing reaction.

A determination of the electrical resistivity directly after bombardment is not possible, in this case, because during different occurrences during the bombardment, a damaging effect results in the silicon, which adulterates or covers up its electrical characteristics. By the capture of a neutron, the affected silicon assumes the kinetic energy of this neutron as recoil energy and will thereby push several neighboring silicon atoms out of their place in the lattice, thus causing so-called Frenkel defects. Furthermore, the β-radiation occurring during the reaction will add to the Frenkel defects. In addition to these comparatively harmless damages, which are annealed at a few hundred degrees, mostly in the reactor itself, the presence of fast neutrons in the neutron bombardment applied, will cause serious crystal defects. For instance, when a central impact of fast neutrons with the nucleus of silicon occurs, so-called head-on collisions, in the close environment of such collisions, up to 2,000 silicon atoms are displaced from their place in the lattice by each impact. This enormous number of vacancy and interstitial atoms leads to a spontaneous cluster formation at this place. Moreover, the fast neutrons cause transfer reactions, e.g., after the pattern of

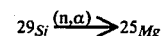

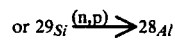

These are reactions in which charged particles of high energy are formed, namely α particles and protons in the MeV-range, as well as magnesium-and-aluminum ions in the some hundred KeV-range. These particles fly like projectiles through the silicon lattice and their stopping leaves considerable lattice disorder in the crystal. By fast neutrons, those are generally understood which have a kinetic energy above 0.1 MeV, whereas this value is followed by the epithermal and thermal neutrons, the latter having an upper limit value of 1 eV. Thermal neutrons are neutrons which are in thermal equilibrium with the surrounding medium, particularly the slow neutrons, which play a role in the process of the instant invention.

Due to the above-mentioned complex lattice damage caused by the bombardment, with the high number of defects and the low level of phosphorus atoms thus created, the electrical properties of the crystal are aulterated and the desired resistivity may, as a consequence, be shifted to higher values of several powers of ten.

To attain the desired success in doping by neutron bombardment, the bombarded silicon crystals have to undergo a heating process in all of the processes known up to the present, in order to build-in the phosphorus atoms formed in the reaction as substitutes in the silicon lattice, and thus to anneal the damage caused by the bombardment. According to German Pat. No. 12 14 789, the specimen which has undergone bombardment is heated in a furnace to 1,000° C. for 24 hours, in order to anneal the damage to the crystal lattice. According to German Offenlegungsschrift (laid open publication) No. 26 074 14, it was observed, however, that in the construction of semiconductor devices from such crystals, the electrical characteristics, especially the resistivity, still changes afterwards during subsequent diffusion processes.

It is an object of this latter application to anneal the articles in a phosphorus-containing atmosphere at a temperature above 1,000° C., for at least one hour. More specifically, the patentee considers it advantageous to subject the specimen to a temperature of 1,230° for 8 hours. However, such annealing processes at high temperatures have great disadvantages. For instance, rising temperatures starting at a limit value of 900° C., above which lies the plastic range of silicon, involve the risk of bringing about the irreversible slip of individual crystal planes with respect to one another. At high temperatures, especially above 1,000° C., another risk increases, namely, that the material to be treated will be damaged by undesirable impurities entering through diffusion.

Moreover, at temperatures as high as that, there is a further danger, which is the formation of clusters between remaining impurities, such as oxygen and carbon, and vacancy or interstitial atoms. Such clusters, as is well known, are very damaging to the properties of silicon devices up causing increased current leakages. Since heating up or cooling down of bombarded silicon material at temperatures above 600° C. must not exceed 3° C. per minute, and above about 900° C., e.g., in the plastic range of silicon, only 1° C. per minute, the total duration of the annealing process increases considerably with rising temperature. Finally, but by no means the least important drawback is to be seen in the fact that these high temperatures cause an increased wear of tempering tubes made of quartz or silicon, since quartz tubes, which are constantly exposed to such high temperatures, tend to be bent through, whereas tempering tubes made of silicon are subject to higher breakage, especially as the temperature increases, particularly when rods of high weights are used.

It is, therefore, an object of the present invention to provide a doping process for silicon based on nuclear transmutation of silicon into phosphorus, brought about by neutron bombardment, wherein the perfect structure of the crystal remains unannealed, without application of interposed annealing procedures, especially at high temperatures, above 1,000° C.

It is a further object of the invention to provide a process of doping silicon by nuclear transmutation of silicon into phosphorus atoms by neutron bombardment in such a manner that a very even distribution of the doping substance is achieved, so that a material is obtained capable of serving as base material for semiconductor devices of highest quality.

Other objects and advantages will become apparent from the following detailed description.

The above-mentioned objects are achieved according to the present invention by adjusting the ratio of thermal: fast neutrons in the neutron flux acting on the silicon under bombardment. If the value of the desired electrical resistivity of the bombarded silicon is to be greater, then the ratio of thermal to fast neutrons has to be increased, or, in other words, the number of $N_{31p}$ has to be smaller and therewith, the effective neutron dose $\phi \cdot t$.

According to the present invention, only accurately-defined amounts of fast neutrons are admitted for certain dose ranges, which can be effected by suitable moderators in the reactor. By this means, the disturbing effect of damage caused by neutron bombardment, more particularly by the fast neutrons-an effect which increases with higher resistances to be reached-can be reduced to an acceptable extent.

Preferably, with a number of desired phosphorus atoms $N_{31p}$ per cc of less than $5 \times 10^{13}$, corresponding to a desired electrical resistivity of more than 100 Ω cm, the ratio between thermal and fast neutrons is adjusted in any case to greater than 1,000, while with a number of desired phosphorus atoms $N_{31p}$ per cc of $5 \times 10^{13}$ to $1 \times 10^{14}$, the ratio between thermal and fast neutrons is adjusted in any case to greater than 10. With highly doped material, e.g., silicon in which the number of desired phosphorus atoms $N_{31p}$ per cc is between $1 \times 10^{14}$ and $5 \times 10^{15}$, the number of fast neutrons during the bombardment is no longer as critical, and it is sufficient to have there a ratio of thermal: fast neutrons which should be slightly greater than 1. To achieve higher doping of silicon with phosphorus, it is necessary, in general, to use such high bombardment dosages that a number of secondary reactions put a limit to the process, because these reactions would lead to long-lived nuclides. In such cases, it is desirable to carry out the doping by conventional processes, e.g., by the addition of phosphorus into the melt in the crucible pulling process according to Czochralski. A rectification of the doping profile which ascends over the length of the rod at the end thereof, can be done, if necessary, in the reactor by neutron-induced nuclear transmutation.

For the bombardment of the starting material, the admissible amount of fast neutrons is determined depending on the desired resistance or the total dose of thermal neutrons; the bombardment is carried out in the reactor stations in accordance with the indicated total dose and the minimum ratio between thermal and fast neutrons. The desired ratio of thermal: fast neutrons is obtained by an arrangement of moderators between the source of the bombardment and the silicon to be acted on. When low resistivities are desired, for instance, resistivities of 20 Ω or less, corresponding to a phosphorus concentration of some $10^{14}$ atoms per cc, or more, the silicon to be bombarded may be suspended directly in the core of a light water reactor, where the ratio of slow: fast neutrons of about 1 is typical. When a higher specific resistivity of the bombarded silicon is desired, for which, according to the invention, the ratio of thermal: fast neutrons should be greater than 10, the silicon rod can, e.g., be suspended in the core of a heavy water reactor or, if a light water reactor is used, a graphite sheet of the required thickness is interposed between the source of the bombardment and the silicon workpiece. The graphite sheet slows down a part of the fast neutrons.

For the preferred production of silicon having high resistivity with a phosphorus concentration of less than $5 \times 10^{13}$ phosphorus atoms per cc, corresponding to an electrical resistivity of more than 100 Ω cm, it is, in any case, necessary, according to the invention, to interpose between the source of the bombardment and the silicon to be acted on, a material which slows down fast neutrons, e.g., a layer of graphite or heavy water. This will allow the ratio of thermal: fast neutrons to adjust itself, which, in any case, is greater than 1,000. In this case, it is especially advantageous to carry out the bombardment in the graphite jacket of a heavy water reactor. The source of bombardment may be nuclear reactors with either constant or pulsating neutron flux. In order to achieve a substantially axial resistance distribution in the silicon workpiece under bombardment, it is desirable to carry out the bombardment in the flat range of the neutron flux, e.g., in the flat range of a neutron flux curve with even neutron concentration.

There is also another way of obtaining flat axial resistance distributions, namely, to carry out the bombardment in the approximately linear descending range of the neutron flux density, then turning the workpiece under bombardment once around its longitudinal axis after half the duration of the bombardment, and then to finish the bombardment. If the processing operator desires a silicon rod having an ascending axial resistance distribution over the length of the rod, it is desirable to carry out the bombardment in the descending range of the neutron flux density.

Before undergoing bombardment, the material is generally etched or chemically polished with acids or, preferably, acid mixtures of highest purity, in order to remove surface impurities, which might be converted into long-lived radioactive isotopes. Suitable acids, whether used singly or in mixture, are especially nitric acid and hydrofluoric acid, if desired, in mixture with acetic acid. Instead of nitric acid, it may be advantageous to use hydrogen peroxide.

During bombardment, the bombarded material may be moved vertically; it also proved useful to rotate the goods in the neutron flux, to improve the homogeneous bombardment. The suitable range for that purpose extends from one turn during the entire bombardment, to 60 rpm in special cases.

When very high neutron doses are to be used, e.g., with a low electrical resistivity desired, it may be advantageous to shorten the duration of bombardment by using material pre-doped by a conventional technique. In that case, a gradient in the course of the resistance can be corrected by suitable bombardment measures, but the so-called "striations," occurring with conventionally-doped, float-zoned material, cannot be removed.

After the radioactivity of the bombarded material has decayed below the accepted limit of $2 \times 10^{-3} \mu$ Curie per gram, the material can be taken out of the reactor station to be further processed. To remove impurities, more particularly metallic residues, from the surface, a precautionary treatment with an alkaline etching agent, e.g., 5–10% aqueous potassium hydroxide solution at elevated temperature of about 70°–100° C., is recommended. There is no necessity to anneal the prepared material, since the crystal damages occurring during the process of the invention, are annealed at the elevated temperatures, especially during the diffusion processes required for the production of devices.

Since without annealing, the actual electrical resistivity cannot be measured, the value of resistivity is assumed for the construction of semiconductor devices, which can be calculated from the bombardment conditions and the pre-doping of the crystal. To check the value, it may, however, be desirable to anneal a test platelet from a bombarded charge for several hours, generally 1–7, but preferably 3–8 hours, at a temperature ranging from about 600° to 1,000° C., preferably 700° to 850° C., and to determine the electrical resistivity subsequently. According to the present invention, it is possible in that case to apply a uniform annealing aprocess for all resistivity ranges and reactor conditions, with the purpose of annealing bombardment damages of a crystal. It is, of course, of no consequence, whether this is done only for checking the resistivity and therewith a correct bombardment in the nuclear reactor, or in order to simplify the treatment of the entire bombarded material.

The reason why the actual resistivity can only be measured after annealing has been performed, lies in the fact that the bombarded silicon has an extremely high electrical resistivity, which can be explained by the superposition of the basic electrical properties by disturbances in the crystal structure. It could be ascertained that in higher-desired resistivities a so-called "inverse annealing" occurs during the bombardment, depending on the amount of fast neutrons in the neutron flux. That is, the exceedingly high resistivity measured immediately after the bombardment drops below the desired electrical resistivity during annealing and only returns to the actually desired resistivity at higher temperatures, usually over 1,100° to 1,200° C. In high resistivity material, moreover, a shift of the annealing threshold to higher temperatures will take place, as it was stated in German Offenlegungsschrift No. 26 07 414. In this publication, it was suggested to anneal the material at a temperature of 1,230° C. for 8 hours, in order to prevent the measured electrical values, especially the electrical resistivity, to change during the subsequent diffusion process.

The process of the present invention starts with the proposition that with increasing desired electrical resistivity, the amount of fast neutrons should be suppressed in the neutron flux during the bombardment. More particularly, when very high electrical resistivities are desired, the amount of fast neutrons should be suppressed below 0.1%; comparatively low temperatures will be sufficient for the annealing, preferably 700° to 850° C., for the annealing of all damages sustained in the bombarded crystal, e.g., damages which would be likely to influence the electrical resistivity behavior, so that a definite value of the resistivity can be measured, a value which would not change during subsequent heat treatments. Therefore, since the crystal damages brought about in the process, according to the present invention, will be quantitatively annealed at comparatively low temperatures, annealing may be dispensed with, as mentioned before, since annealing takes place anyway, in the following diffusion processes.

For very special materials with very low tolerances in the desired resistivity, the process of the instant invention may be repeatedly carried out, in order to increase the accuracy of the resistivity, in which case one will reach the desired resistance value approximately from higher values. In that case, annealing of the material is required between the several bombardment steps, in order to obtain accurate information about the electrical resistivity reached in each step.

The doping process, according to the instant invention, can, of course, be used successfully if it is intended to introduce in silicon, regardless of its kind, a homogeneous phosphorus concentration. The process is therefore not limited to the treatment of monocrystalline silicon rods, but may be applied likewise to polycrystalline material of any form, as well as to sawn, lapped, polished or epitaxial wafers.

In the following, the process of the present invention will be more fully described in an Example, but it should be understood that this is given by way of illustration, and not by way of limitation.

EXAMPLE 15 zone-floated silicon rods of high electrical resistivity, n-conductivity, a length of 50 cm and diameter of 5 cm, were subjected to nuclear transmutation by neutron bombardment, resulting in P-doping. Before being bombarded, the rods were chemically polished uniformly, with an acid mixture consisting of 32 vol. parts of 50–65% by weight, of aqueous nitric acid and 11 vol. parts of 40%, by weight, of aqueous hydrofluoric acid. In the following Table 1, a summary is given of the rods treated according to the instant invention. For comparison, 5 rods were treated with neutron doses, which contained too high an amount of fast neutrons for the intended specific resistance to be obtained. The results of these treatments are listed in Table 2.

Rods 30636/4B, 30636/4D, 30865/4ID, 30865/4IC and 20989/14 were suspended for bombardment in the core of a light water reactor, in which a ratio of thermal: fast neutrons was equal to 1. Rods 31146/I, 30765/IB, 31102/4I, 311541/3II and 31147/8II were directly suspended in the core of a heavy water reactor, with a ratio of thermal: fast neutrons between 10 and 100. Rods 41155/17, 23534/13A, 23352/22II, 31013/4 and 23511/9I were bombarded in the outer graphite jacket of a heavy water reactor, where the ratio of thermal: fast neutrons was more than 1,000 (between 1,000 and 1,200).

The rods in the core of the light water reactor were rotated around their longitudinal axis by 180° after half of the bombardment time. The rods in the core of the heavy water reactor were rotated about their longitudinal axis with 10 rpm during the bombardment. The rods in the graphite jacket of the heavy reactor were rotated at 1 rpm about their longitudinal axis. To measure the electrical resistivity, e.g., the actual resistivity after bombardment, all the rods were annealed before measuring, for 7 hours at 800° C. The measured actual resistivity did not change in the rods bombarded, according to the instant invention, as shown in Table 1, even after a further test annealing over 1,000° C. However, the rods listed in Table 2, which were not bombarded by the process according to the instant invention, showed the indicated values, after an annealing of 7 hours at 800° C., which are considerably different from the electrical resistivity desired. Only after an annealing above 1,100° C. (Rod numbers 30865/4ID, 311451/3II) and 1,200° C., respectively, for rods 30865/IC, 20989/14, and 31147/8II, the actual values for the electrical resistivity approximated the desired values of electrical resistivity for which the neutron dose was calculated.

As may be seen from the Example, the process of the instant invention makes it possible to have a uniform annealing operation for all ranges of resistivities at comparatively low temperatures, in order to determine the actual value of electrical resistivity covered up immediately after bombardment by crystal damages.

In summary, the instant invention provides a process for incorporating phosphorus in silicon in homogeneous distribution by nuclear transmutation caused by neutron bombardment, wherein the slowing down of the fast neutrons present in the neutron bombardment of a core reactor, is increased in order to increase the electrical resistivity of the bombarded silicon. Thus, a uniform annealing process is rendered feasible at comparatively low temperatures. The process need only be carried out for purposes of control, since the crystal damages caused by the process, according to the instant invention, are annealed at the higher temperatures obtained during subsequent diffusion processes occurring in the further processing for producing silicon devices.

TABLE 1

| | BOMBARDMENT WITH AN AMOUNT OF FAST NEUTRONS, ACCORDING TO THE INVENTION, CALCULATED ON THE DESIRED ELECTRICAL RESISTIVITY | | | | |
|---|---|---|---|---|---|
| ROD NUMBER | NEUTRON RATIO $n_{thermal}/n_{fast}$ | NEUTRON DOSE $\phi \cdot t \cdot 10^{17}$ [cm$^{-2}$] | ELECTRICAL RESISTIVITY DESIRED $\rho[\Omega \cdot cm]$ / $N_{31p}/cm^3 Si$ | ELECTRICAL RESISTIVITY FOUND $\rho[\Omega \cdot cm]$ | ELECTRICAL RESISTIVITY BEFORE BOMBARDMENT $\rho[\Omega \cdot cm]$ |
| 30636/4B | ~1 | 11.5 | 20 / $2.4 \times 10^{14}$ | 20.5 | 1500 n-conductivity |
| 30636/4D | ~1 | 11.55 | 20 / $2.4 \times 10^{14}$ | 20.5 | 2300 " |
| 31146/1 | 10–100 | 11.64 | 20 / $2.5 \times 10^{14}$ | 20.3 | 820 " |
| 30765/1B | 10–100 | 5.6 | 40 / $1.3 \times 10^{14}$ | 40 | 900 " |
| 31102/4I | 10–100 | 2.57 | 88.5 / $5.7 \times 10^{13}$ | 88 | 4100 " |
| 41155/17 | >1000 | 11.2 | 21 / $2.4 \times 10^{14}$ | 21.1 | 1800 " |
| 23534/13A | >1000 | 4.37 | 53 / $9.5 \times 10^{13}$ | 53.5 | 2000 " |
| 23353/22II | >1000 | 2.57 | 90 / $5.6 \times 10^{13}$ | 90 | 3000 " |
| 31013/4 | >1000 | 1.58 | 140 / $3.7 \times 10^{13}$ | 142.5 | 2200 " |
| 23511/9I | >1000 | 0.89 | 240 / $2.2 \times 10^{13}$ | 245 | 2300 " |

TABLE 2

| | BOMBARDMENT WITH TOO LARGE AN AMOUNT OF FAST NEUTRONS, AS FOUND BY THE INSTANT INVENTION, CALCULATED ON THE DESIRED ELECTRICAL RESISTIVITY | | | | |
|---|---|---|---|---|---|
| ROD NUMBER | NEUTRON RATIO $n_{thermal}/n_{fast}$ | NEUTRON DOSE $\Phi \cdot t \cdot 10^{17}$ [cm$^{-2}$] | ELECTRICAL RESISTIVITY DESIRED $\rho[\Omega \cdot cm]$ / $N_{31p}/cm^3 Si$ | ELECTRICAL RESISTIVITY FOUND $\rho[\Omega \cdot cm]$ | ELECTRICAL RESISTIVITY BEFORE BOMBARDMENT $\rho[\Omega \cdot cm]$ |
| 30865/4ID | ~1 | 1.5 | 150 / $3.4 \times 10^{13}$ | 125 | 5000 n-conductivity |
| 30865/4IC | ~1 | 1.3 | 175 / $3 \times 10^{13}$ | 150 | 5000 " |
| 20989/14 | ~1 | 1.07 | 210 / $1.1 \times 10^{13}$ | 175 | 5500 " |
| 311541/3II | 10–100 | 2.12 | 105 / $4.8 \times 10^{13}$ | 101 | 1850 " |
| | | | 270 | | |

TABLE 2-continued

BOMBARDMENT WITH TOO LARGE AN AMOUNT OF FAST NEUTRONS,
AS FOUND BY THE INSTANT INVENTION,
CALCULATED ON THE DESIRED ELECTRICAL RESISTIVITY

| ROD NUMBER | NEUTRON RATIO $\frac{n_{thermal}}{n_{fast}}$ | NEUTRON DOSE $\Phi \cdot t \cdot 10^{17} [cm^{-2}]$ | ELECTRICAL RESISTIVITY DESIRED $\rho [\Omega \cdot cm]$ $N_{31p}/cm^3 Si$ | ELECTRICAL RESISTIVITY FOUND $\rho [\Omega \cdot cm]$ | ELECTRICAL RESISTIVITY BEFORE BOMBARDMENT $\rho [\Omega \cdot cm]$ |
|---|---|---|---|---|---|
| 31147/8II | 10–100 | 0.81 | $1.9 \times 10^{13}$ | 220 | 3500 |

What is claimed is:

1. A process for the production of n-doped silicon with minimal crystal damage caused by neutron bombardment, in which phosphorus atoms are formed from silicon by nuclear transmutation, wherein the number of desired phosphorus atoms $N_{31p}$ per cc can be calculated by the known equation $$N_{31P} = N_{30Si} \cdot \sigma \cdot \phi \cdot t$$

in which $N_{30Si}$ is the number of $^{30}Si$-isotopes per cc, $\sigma = 0.13$ barn effective cross-section, $\phi$ the flux density of the thermal neutrons per cm$^2$ and t the bombardment time in seconds, the process comprising the step of adjusting the ratio of thermal to fast neutrons in a neutron flux comprising both thermal and fast neutrons, acting upon the bombarded silicon, so that the higher the desired electrical resistivity of the bombarded silicon and thus the lower the number of $N_{31p}$ the higher the ratio of thermal to fast neutrons, and wherein with a number of desired phosphorus atoms $N_{31p}$ per cc of less than $5 \times 10^{13}$ corresponding to a desired electrical resistivity of more than 100 $\Omega$ cm, the ratio of thermal to fast neutrons is adjusted to greater than 1000 and with a number of the desired phosphorus atoms $N_{31p}$ per cc of $5 \times 10^{13}$ to $1 \times 10^{14}$, the ratio of thermal to fast neutrons is adjusted to greater than 10.

2. The process according to claim 1, wherein the desired ratio of thermal: fast neutrons is adjusted by slowing down the fast neutrons by means of a graphite layer of required thickness interposed between the source of bombardment and the silicon to be bombarded.

3. The process according to claim 1, wherein the desired ratio of thermal: fast neutrons is adjusted by slowing down the fast neutrons by means of a heavy water layer of required thickness, interposed between the source of bombardment and the silicon to be bombarded.

4. The process according to claim 1, wherein for obtaining a substantially flat axial resistance distribution in the silicon to be bombarded, the bombardment is carried out in the flat range of the neutron flux.

5. The process as claimed in claim 1, wherein the silicon to be bombarded is chemically polished before being bombarded, with a suitable acid mixture and rinsed in de-ionized water 6. The process according to claim 1, wherein, for the control of the accuracy of the adjustment of the desired neutron dose in any individual case, test specimens of the bombarded silicon are subjected to an annealing process for 3 to 8 hours at a temperature between 700° and 850° C.

* * * * *